United States Patent [19]

Kawada et al.

[11] Patent Number: 5,606,484

[45] Date of Patent: Feb. 25, 1997

[54] CERAMIC ELECTROSTATIC CHUCK WITH BUILT-IN HEATER

[75] Inventors: Nobuo Kawada; Kazuhiro Yamaguchi, both of Gunma-ken, Japan

[73] Assignee: Shin-Etsu Chemical Co., Ltd., Tokyo, Japan

[21] Appl. No.: 263,533

[22] Filed: Jun. 22, 1994

[30] Foreign Application Priority Data

Jun. 23, 1993 [JP] Japan .................................. 5-152015

[51] Int. Cl.$^6$ .................................................. H02N 13/00
[52] U.S. Cl. ................................... 361/234; 279/128
[58] Field of Search ........................... 361/234; 279/128; 269/8; 29/825, 829

[56] References Cited

U.S. PATENT DOCUMENTS

| | | | |
|---|---|---|---|
| 5,155,652 | 10/1992 | Logan et al. ........................ | 361/234 |
| 5,280,156 | 1/1994 | Niori et al. ........................ | 361/234 X |
| 5,324,053 | 6/1994 | Kubota et al. ..................... | 361/234 X |
| 5,384,682 | 1/1995 | Watanabe et al. ................... | 361/234 |
| 5,413,360 | 5/1995 | Atari et al. ....................... | 361/234 X |

*Primary Examiner*—Fritz M. Fleming
*Attorney, Agent, or Firm*—McAulay Fisher Nissen Goldberg & Kiel, LLP

[57] ABSTRACT

A novel ceramic electrostatic chuck with built-in heater is proposed which is outstandingly durable in use with repeated cycles of heating and cooling because of the absence of troubles due to exfoliation of layers and crack formation in the ceramic body. Differently from conventional ceramic electrostatic chuck with built-in heater consisting of a base plate of sintered body of boron nitride, layers of pyrolytic graphite formed on the surfaces of the base plate to serve, one, as the electrode layer and, the other, as the heater element, and an insulating layer of pyrolytic boron nitride formed on the pyrolytic graphite layers, the base plate in the invention is made of a composite sintered body of a powder mixture of aluminum and boron nitrides in a specified mixing proportion so as to minimize the difference in the thermal expansion coefficient from those of the overlaying layers.

2 Claims, 2 Drawing Sheets

5,606,484

CERAMIC ELECTROSTATIC CHUCK WITH BUILT-IN HEATER

BACKGROUND OF THE INVENTION

The present invention relates to a novel ceramic electrostatic chuck with built-in heater or, more particularly, relates to a ceramic-made electrostatic chuck with built-in heater used in the processing of electronic devices for heating and cooling of a work piece under firm holding by the electrostatic attractive force of the electrostatic chuck.

In the manufacturing process of various semiconductor devices, the work piece such as a semiconductor silicon wafer is sometimes heated to an elevated temperature under firm holding on a ceramic-made heater plate. A most conventional means for holding a silicon wafer under processing is a so-called electrostatic chuck which can be used even in vacuum where traditional vacuum-sucking chucks can no longer work for sucking. When a silicon wafer as a work piece to be processed is desired to be heated under firm holding, it is a due idea to use an electrostatic chuck provided with a built-in heater (see, for example, Japanese Patent Kokai 4-358074). The ceramic electrostatic chuck with built-in heater disclosed there typically has a structure consisting of a base plate of a ceramic material such as a sintered body of boron nitride, an electrode layer formed on a surface of the base plate from pyrolytic graphite, a heater element layer formed on the other surface of the base plate also from pyrolytic graphite and an insulating ceramic layer formed on the electrode layer and the heater element layer from, for example, pyrolytic boron nitride. It is a trend accordingly that the dielectric material of the electrostatic chuck is under continuous replacement of conventional synthetic resins with a ceramic material as is disclosed in Japanese Patent Kokai 52-67353 and 59-124140.

The above mentioned ceramic electrostatic chuck with built-in heater has a problem in respect of the durability of the material of the base plate which is a sintered body of boron nitride because sintered bodies of boron nitride have a thermal expansion coefficient which is quite different from the coefficient in the pyrolytic graphite forming the electroconductive layer and the pyrolytic boron nitride forming the insulating layers, i.e. the electrode layer and the heater element layer, so that troubles are sometimes unavoidable when the ceramic electrostatic chuck is subjected to repeated cycles of heating and cooling to cause exfoliation of layers and crack formation in the ceramic body under thermal stress.

SUMMARY OF THE INVENTION

The present invention accordingly has an object to provide a novel ceramic electrostatic chuck with built-in heater free from the above described problems and disadvantages in the prior art and having excellent resistance against exfoliation of layers or crack formation in the ceramic body.

The ceramic electrostatic chuck with built-in heater provided by the invention is an integral body which comprises:

(a) a base plate formed from a composite sintered body consisting of a mixture of aluminum nitride and boron nitride in a mixing ratio in the range from 5:95 to 50:50 or, preferably, from 7:93 to 13:87 by weight;

(b) a layer of pyrolytic graphite to serve as an electrode of the electrostatic chuck formed on a surface of the base plate;

(c) a layer of pyrolytic graphite to serve as an electric heater element of the built-in heater formed on the other surface of the base plate; and (d) a layer of pyrolytic boron nitride to serve as an electric insulator formed on the layers of the pyrolytic graphite.

DETAILED DESCRIPTION OF THE PREFERRED EMBODIMENTS

Figure 1:
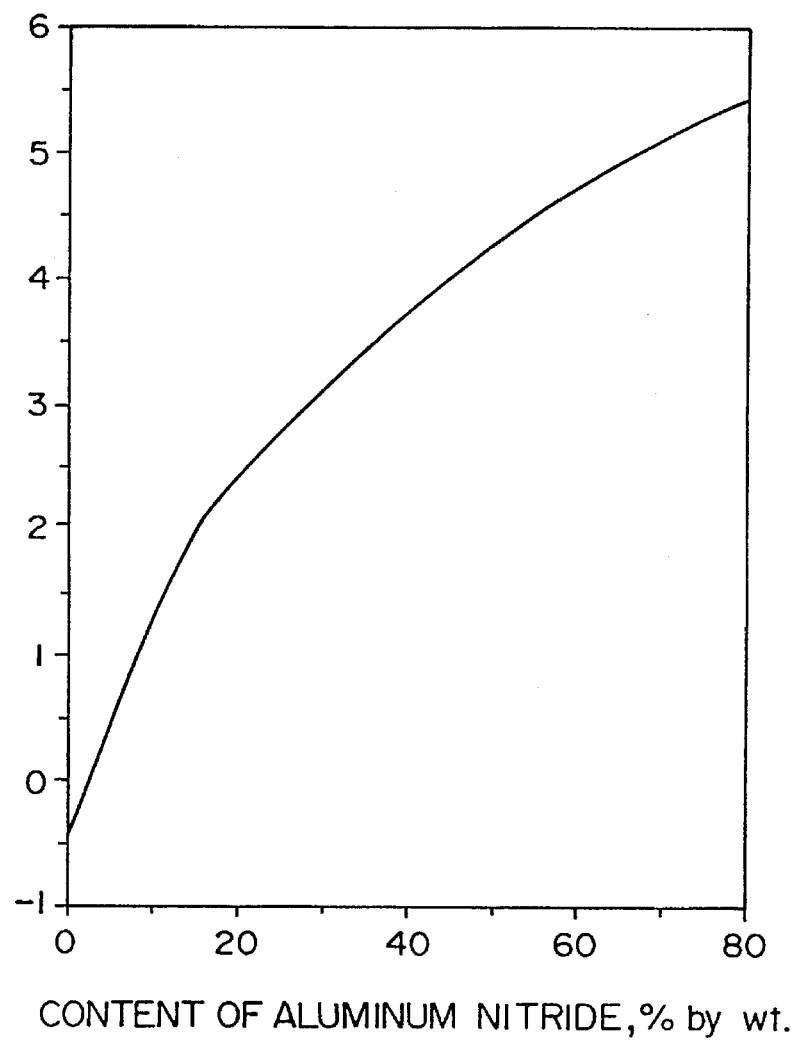
FIG. 1 is a graph showing the thermal expansion coefficient of a composite sintered body of aluminum nitride and boron nitride in the range of 50° C. to 800° C. as a function of the content of aluminum nitride therein.
Figure 2:
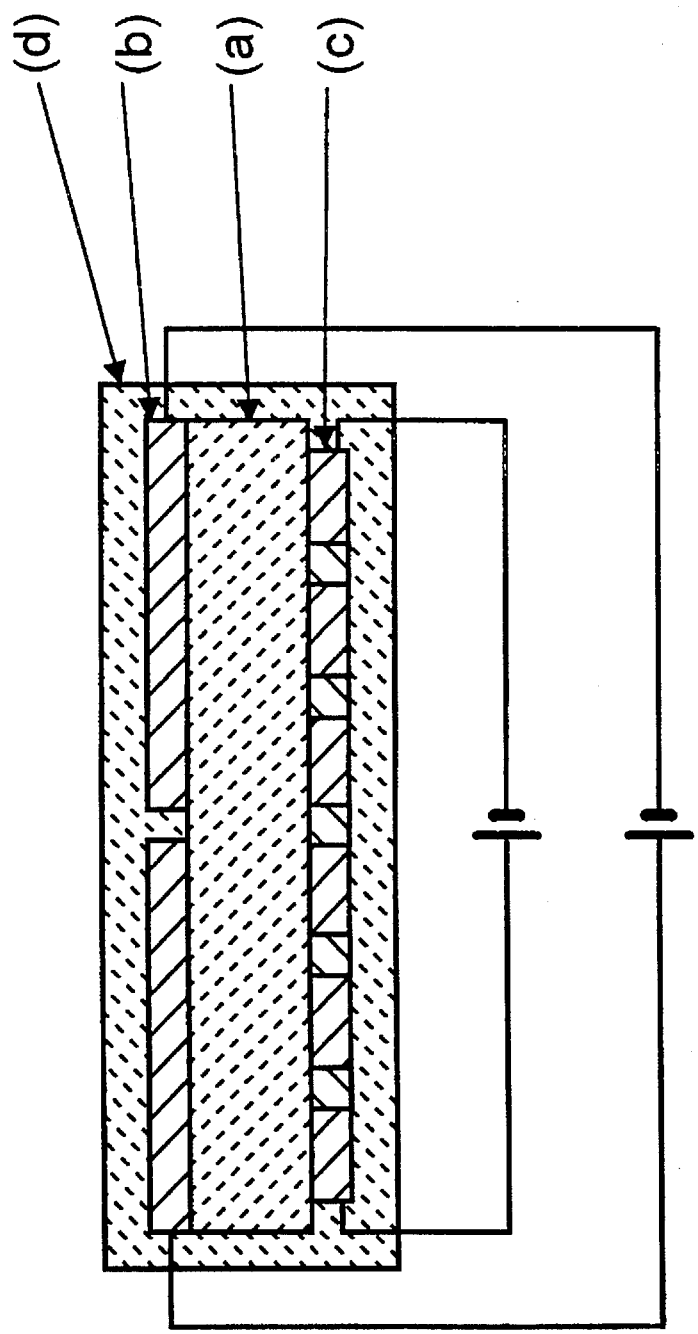
FIG. 2 is a cross-sectional view of a ceramic electrostatic chuck in accordance with the invention.

The above described unique structure of the inventive ceramic electrostatic chuck with built-in heater, which comprises a ceramic base plate, (b) an electrode layer made from pyrolytic graphite, (c) a layer of heater element made from pyrolytic graphite and (d) an insulating ceramic layer, has been established as a result of the extensive investigations undertaken by the inventors with an object to solve the problems in the prior art ceramic electrostatic chucks with built-in heater leading to a discovery that, when the base plate of the electrostatic chuck is formed from a composite sintered body of aluminum nitride and boron nitride in an appropriate mixing ratio, the troubles of exfoliation between layers or crack formation in the base plate can be prevented in a ceramic electrostatic chuck having layers of pyrolytic graphite to serve as the electrode of the electrostatic chuck and as the heater element and an insulating layer of pyrolytic boron nitride even by many times of repetition of heating and cooling cycles, for example, in the manufacturing process of semiconductor devices by virtue of the small difference in the thermal expansion coefficients between the composite sintered body and the pyrolytic graphite or pyrolytic boron nitride. Accordingly, durability of the electrostatic chuck with built-in heater can be greatly increased to contribute to the manufacturing costs of semiconductor devices as a consequence of the decrease in the maintenance cost of the manufacturing apparatus and the time taken for the maintenance service.

The ceramic electrostatic chuck with built-in heater has an electrode layer and a heater element layer on a ceramic base plate which is a composite sintered body prepared by hot-pressing a powder mixture of aluminum nitride and boron nitride in an appropriate mixing ratio, for example, under compressive force of 150 kgf/cm$^2$ at 1900° C. The powders of aluminum and boron nitrides to be mixed together each should have an average particle diameter as fine as possible or, for example, in the range from 0.1 to 10 μm.

It has been discovered that the thermal expansion coefficient of such a composite sintered body of aluminum nitride and boron nitride depends on the content of aluminum nitride, i.e. weight proportion of aluminum nitride to the total amount of aluminum and boron nitrides, and varies, as is shown in the figure of the accompanying drawing, in the range from −0.5 to 5.5×10$^{-6}$/°C. When the content of aluminum nitride is varied in the range from 5% to 50% by weight, the thermal expansion coefficient of the composite sintered body varies in the range from 0.6 to 4.1×10$^{-6}$/°C. to coincide with the thermal expansion coefficient of pyrolytic boron nitride and, when the content of aluminum nitride is selected in the range from 7% to 13% by weight, the thermal expansion coefficient of the composite sintered body falls within the range from 0.8 to $1.6 \times 10^{-6}$/°C. to coincide with the thermal expansion coefficient of pyrolytic graphite. The ceramic base plate has a thickness in the range from 5 to 100 mm.

The pyrolytic graphite layers formed on one and the other surfaces of the base plate have a thickness in the range from 10 to 300 μm while the insulating pyrolytic boron nitride layer formed on the pyrolytic graphite layers should have a thickness in the range from 50 to 500 μm.

When the composite sintered body of aluminum and boron nitrides is prepared from a powder mixture thereof in an appropriate mixing proportion, accordingly, the base plate of the electrostatic chuck has a thermal expansion coefficient without or with little difference not only from that of pyrolytic graphite forming the electrode layer and the heater element layer but also from that of pyrolytic boron nitride forming the insulating layer so that the electrostatic chuck with built-in heater can be used with excellent durability even when used with many times of repeated heating and cooling cycles in the manufacturing process of semiconductor devices without troubles of exfoliation of layers and crack formation in the ceramic body due to the large difference in the thermal expansion coefficients. Thus, the content of aluminum nitride in the composite sintered body as the base body of the electrostatic chuck is in the range from 5% to 50% or, preferably, in the range from 7% to 13%.

Advantageously, the composite sintered body of aluminum and boron nitrides as the base plate of the electrostatic chuck does not suffer from a noticeable decrease in the mechanical strengths when the content of aluminum nitride therein does not exceed 80% by weight at a temperature of 1000° C. to 1900° C. at which the layers of pyrolytic graphite and pyrolytic boron nitride are formed by the chemical vapor deposition method and the like.

In the following, the ceramic electrostatic chuck with built-in heater of the present invention is illustrated in more detail by way of an example and a comparative example.

EXAMPLE

A mixture consisting of 10% by weight of aluminum nitride powder having an average particle diameter of about 1 μm and 90% by weight of boron nitride powder having an average particle diameter of about 3 μm was compression-molded and sintered by hot-pressing under a pressure of 150 kgf/cm$^2$ at 1900° C. for 60 minutes into a composite sintered body of aluminum and boron nitrides, which was mechanically worked into a disc-formed base plate having a diameter of 200 mm and a thickness of 6 mm.

The base body was set in a reaction chamber of CVD (chemical vapor deposition) process, in which propane gas was pyrolytically decomposed under a pressure of 5 Torr and the pyrolytically formed graphite was deposited on both surfaces of the base plate until the pyrolytic graphite layer on each surface had a thickness of 50 μm followed by mechanical working of the pyrolytic graphite layer, one, into the forms of an electrode for electrostatic chuck and, the other, into the form of a heater element. Further, the base plate provided with the pyrolytic graphite layers was set in a CVD reaction chamber and pyrolytic boron nitride was deposited on the graphite layers by the pyrolytic decomposition of a gaseous mixture of ammonia and boron trichloride until the pyrolytic boron nitride layer deposited on the graphite layers had a thickness of 100 μm as an insulating layer on the electrode layer and the heater element layer to finish a ceramic electrostatic chuck with built-in heater according to the invention.

The electrostatic chuck with built-in heater was set in a testing apparatus and subjected to a test of repeated cycles of heating and cooling between 100° C. and 1000° C. at a constant rate of 5° C./minute for elevation and decreasing of the temperature to obtain a result that no troubles such as exfoliation of layers and crack formation took place even after 100 times repetition of the heating and cooling cycles.

COMPARATIVE EXAMPLE

The experimental procedure for the preparation of a ceramic electrostatic chuck with built-in heater was substantially the same as in Example described above except that the base plate of the electrostatic chuck was a sintered body of boron nitride powder alone instead of the composite sintered body consisting of aluminum and boron nitrides. This electrostatic chuck was subjected to the same durability test as in Example by repeating the cycles of heating and cooling to find formation of cracks in the insulating layer of pyrolytic boron nitride after 30 cycles of heating and cooling.

What is claimed is:

1. A ceramic electrostatic chuck with built-in heater which is an integral body comprising:

(a) a base plate having opposing first and second surfaces formed from a composite sintered body of a powder mixture consisting of from 5% to 50% by weight of aluminum nitride and from 95% to 50% by weight of boron nitride;

(b) a layer of pyrolytic graphite to serve as an electrode of the electrostatic chuck formed on the first surface of the base plate;

(c) a layer of pyrolytic graphite to serve as an electric heater element of the built-in heater formed on the second surface of the base plate; and (d) a coating layer of pyrolytic boron nitride as an electric insulator formed on the layers of the pyrolytic graphite.

2. The ceramic electrostatic chuck with built-in heater as claimed in claim 1 in which the powder mixture for the composite sintered body consists of from 7% to 13% by weight of aluminum nitride and from 93% to 87% by weight of boron nitride.

* * * * *